US010224425B2

(12) United States Patent
Takeuchi et al.

(10) Patent No.: US 10,224,425 B2
(45) Date of Patent: Mar. 5, 2019

(54) ELECTRIC POWER CONVERTER

(71) Applicant: HITACHI POWER SEMICONDUCTOR DEVICE, LTD., Hitachi-shi, Ibaraki (JP)

(72) Inventors: Yujiro Takeuchi, Tokyo (JP); Mutsuhiro Mori, Tokyo (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 0 days.

(21) Appl. No.: 15/767,310

(22) PCT Filed: Oct. 17, 2016

(86) PCT No.: PCT/JP2016/080650
§ 371 (c)(1),
(2) Date: Apr. 10, 2018

(87) PCT Pub. No.: WO2017/069073
PCT Pub. Date: Apr. 27, 2017

(65) Prior Publication Data
US 2018/0301549 A1    Oct. 18, 2018

(30) Foreign Application Priority Data

Oct. 20, 2015   (JP) ................................ 2015-206056

(51) Int. Cl.
*H01L 29/739*     (2006.01)
*H01L 29/872*     (2006.01)
(Continued)

(52) U.S. Cl.
CPC ...... *H01L 29/7397* (2013.01); *H01L 29/1095* (2013.01); *H01L 29/1608* (2013.01);
(Continued)

(58) Field of Classification Search
CPC .......... H02M 7/5387; H02M 7/53862; H02M 7/515; H02M 3/10; H02M 3/145;
(Continued)

(56) References Cited

U.S. PATENT DOCUMENTS 5,661,644 A     8/1997  Bergman et al.
6,359,498 B1 *  3/2002  Kurihara ................. H03G 1/04
                                              327/513
(Continued)

FOREIGN PATENT DOCUMENTS

JP      1-171320 A      7/1989
JP    2006-149195 A     6/2006
(Continued)

OTHER PUBLICATIONS

International Search Report of International Application No. PCT/JP2016/080650, dated Nov. 15, 2016.

*Primary Examiner* — Adolf D Berhane
(74) *Attorney, Agent, or Firm* — Miles & Stockbridge P.C.

(57)    ABSTRACT

An electric power converter (100) which is provided with a switching element (101) and a rectifying element (102) that is connected in series to the switching element (101). This electric power converter (100) has a configuration wherein an external electrical load (103) is connected to the connection point of the switching element (101) and the rectifying element (102). The switching element (101) is composed of an insulating gate type semiconductor element that has a first gate terminal (105) and a second gate terminal (106). The rectifying element (102) is composed of a diode that has a Schottky junction which uses silicon carbide as a semiconductor base. Different driving signals are applied to the first gate terminal (105) and the second gate terminal (106), respectively.

12 Claims, 9 Drawing Sheets

(51) Int. Cl.

| | |
|---|---|
| *H02M 1/08* | (2006.01) |
| *H01L 29/78* | (2006.01) |
| *H02M 7/48* | (2007.01) |
| *H02M 7/5387* | (2007.01) |
| *H03K 17/0812* | (2006.01) |
| *H03K 17/0814* | (2006.01) |
| *H03K 17/16* | (2006.01) |
| *H01L 29/10* | (2006.01) |
| *H01L 29/16* | (2006.01) |
| *H02M 1/00* | (2006.01) |
| *H02P 27/06* | (2006.01) |

(52) U.S. Cl.
CPC ............ *H01L 29/739* (2013.01); *H01L 29/78* (2013.01); *H01L 29/872* (2013.01); *H02M 1/08* (2013.01); *H02M 7/48* (2013.01); *H02M 7/5387* (2013.01); *H02M 7/53875* (2013.01); *H03K 17/08128* (2013.01); *H03K 17/08148* (2013.01); *H03K 17/163* (2013.01); *H03K 17/168* (2013.01); *H02M 2001/0048* (2013.01); *H02P 27/06* (2013.01); *Y02B 70/1483* (2013.01); *Y02B 70/1491* (2013.01)

(58) Field of Classification Search
CPC .. H02M 1/08; H01L 29/7397; H01L 29/1095; H01L 29/1608; H01L 29/872; H03K 17/168; H03K 17/687; H03K 17/08
See application file for complete search history.

(56) References Cited

U.S. PATENT DOCUMENTS

| | | | |
|---|---|---|---|
| 8,502,323 B2* | 8/2013 | Chen | H01L 29/7786 257/392 |
| 9,853,637 B1* | 12/2017 | Meiser | H03K 7/08 |
| 2003/0173619 A1* | 9/2003 | Feldtkeller | H01L 29/7813 257/330 |
| 2006/0062032 A1* | 3/2006 | Soldano | H02M 7/219 363/125 |
| 2006/0232253 A1* | 10/2006 | Salato | H02M 1/36 323/225 |
| 2008/0265278 A1 | 10/2008 | Hara et al. | |
| 2009/0168471 A1* | 7/2009 | Tsugawa | H01L 29/8611 363/56.01 |
| 2010/0135053 A1* | 6/2010 | Morimoto | H02M 3/1582 363/127 |
| 2011/0073905 A1* | 3/2011 | Mori | H01L 27/0664 257/140 |
| 2016/0322967 A1* | 11/2016 | Inakagata | H02M 3/33569 |
| 2017/0257025 A1* | 9/2017 | Meiser | H02M 3/156 |

FOREIGN PATENT DOCUMENTS

| | | |
|---|---|---|
| JP | 2008-270377 A | 11/2008 |
| JP | 2014-147237 A | 8/2014 |

* cited by examiner

ELECTRIC POWER CONVERTER

TECHNICAL FIELD

The present invention relates to a power conversion device.

BACKGROUND ART

A power conversion device in which an IGBT (Insulated Gate Bipolar Transistor or insulated gate semiconductor device: hereinafter, appropriately referred to as "IGBT" or "Si-IGBT") using Si (silicon) for a semiconductor substrate and a Schottky barrier diode (hereinafter, appropriately referred to as "SiC-SBD") using SiC (silicon carbide) for a semiconductor substrate are combined is described in PTL 1.

In PTL 1, technology of a converter circuit is disclosed as "[Problem] To provide a converter circuit of a type for improving weakness related to a known converter circuit. [Solution] The converter circuit includes at least one switching device (5 and 6) and a diode arranged to become conductive when the device is turned off and to become biased in a reverse direction when the device is turned on. This diode consists of silicon carbide (refer to Abstract)".

CITATION LIST

Patent Literature

PTL 1: JP 2006-149195 A

SUMMARY OF INVENTION

Technical Problem

However, the technology disclosed in PTL 1 has the following problem.

In the converter circuit (power conversion device) according to the technology disclosed in PTL 1, there is a problem in that a voltage/current of each of the Si-IGBT and the SiC-SBD oscillates (transient oscillation) when the Si-IGBT is turned on.

The present invention has been devised in view of the above problem and an object thereof is to provide a power conversion device that can suppress voltage/current oscillations (transient oscillations) while using an SiC-SBD having characteristics of a high withstand voltage and a low recovery loss.

Solution to Problem

To solve the above problem and achieve the object of the present invention, the following configuration is taken.

That is, a power conversion device according to the present invention is a power conversion device including a switching element and a rectifier element connected in series with the switching element. The power conversion device has a configuration in which an external electric load is connected to a connection point of the switching element and the rectifier element, the switching element is composed of an insulated gate semiconductor element having a first gate terminal and a second gate terminal, the rectifier element is composed of a diode having a Schottky junction using silicon carbide as a semiconductor substrate, and different drive signals are applied to the first gate terminal and the second gate terminal, respectively.

In addition, other mechanisms will be described in embodiments of the present invention.

Advantageous Effects of Invention

According to the present invention, it is possible to provide a power conversion device that can suppress voltage/current oscillations while using an SiC-SBD in a rectifier element having characteristics of a high withstand voltage and a low recovery loss.

BRIEF DESCRIPTION OF DRAWINGS

FIGS. 3(a) to 3(c) are diagrams showing voltage/current waveforms of each unit of a circuit when a switching element is switched from an off state to an on state in the power conversion device according to the comparative example, wherein FIG. 3(a) shows $V_g$ of the switching element, FIG. 3(b) shows $V_s$ and a current Is of the switching element, and FIG. 3(c) shows $V_d$ applied to a rectifier element and $I_d$.

FIGS. 6(a) to 6(d) are diagrams showing voltage/current waveforms of each unit of a circuit when a switching element is switched from an off state to an on state in the power conversion device according to the first embodiment of the present invention, wherein FIG. 6(a) shows $V_{g1}$ of a first gate electrode of the switching element, FIG. 6(b) shows $V_{g2}$ of a second gate electrode of the switching element, FIG. 6(c) shows $V_s$ and $I_s$ of the switching element, and FIG. 6(d) shows $V_d$ and $I_d$ of a rectifier element.

DESCRIPTION OF EMBODIMENTS

Hereinafter, embodiments of the present invention will be described appropriately with reference to the drawings.

«First Embodiment: First Part»

A power conversion device according to a first embodiment of the present invention will be described with reference to FIGS. 1, 5, and 6(a) to 6(d).

Figure 1:
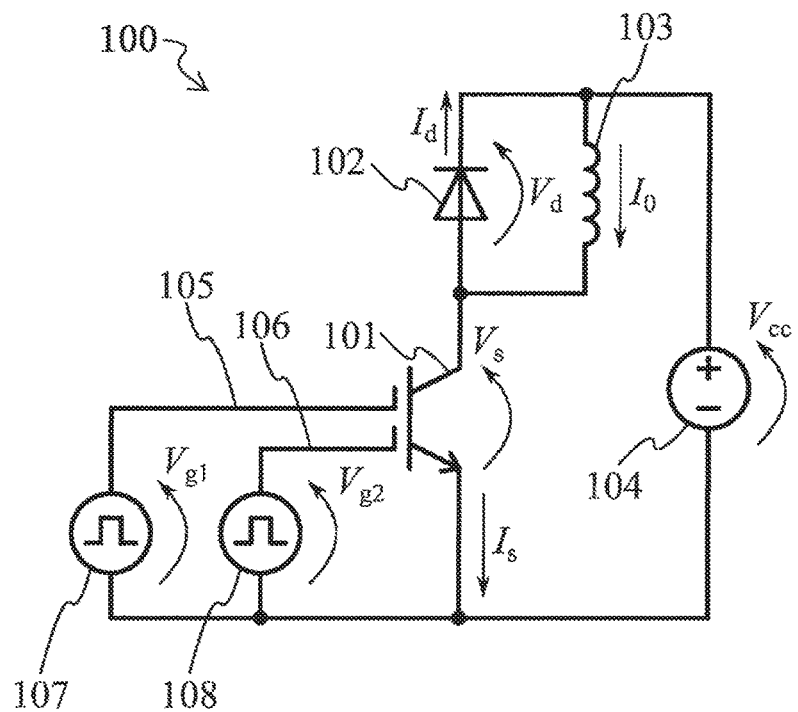
FIG. 1 is a diagram showing a circuit configuration example of a power conversion device according to a first embodiment of the present invention.

FIG. 1 is a diagram showing a circuit configuration example of the power conversion device according to the first embodiment of the present invention.

In FIG. 1, a power conversion device 100 includes a switching element (IGBT) 101 having a first gate terminal (insulated gate terminal) 105 and a second gate terminal 106 and a rectifier element (SiC-SBD) 102.

In addition, the power conversion device 100 has a configuration in which power is supplied from a voltage source 104 and the switching element 101 repeats turning-on and turning-off at a high speed to control power supplied to an electric load (inductive load) 103 connected in parallel with the rectifier element 102.

The electric load (inductive load) 103 is, for example, a motor to be an inductive load.

Figure 2:
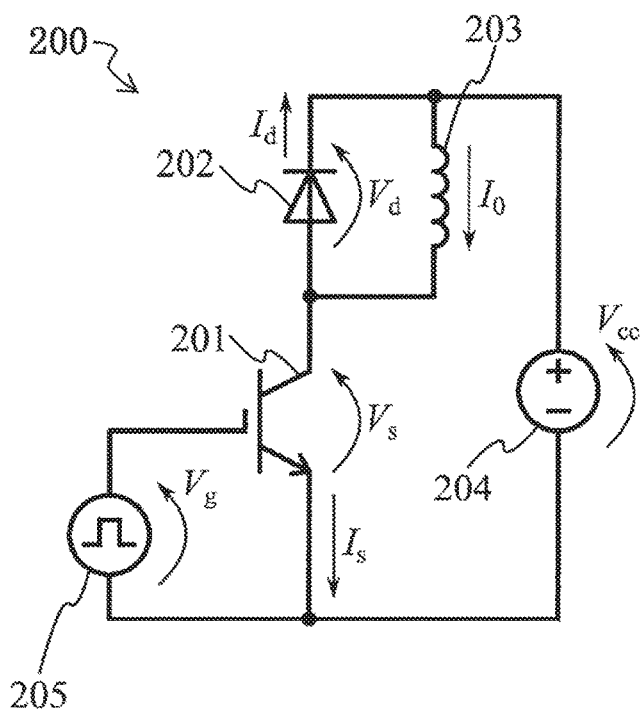
FIG. 2 is a diagram showing a circuit configuration example of a power conversion device according to a comparative example.

Before describing a detailed configuration and an operation and an effect of the power conversion device 100 shown in FIG. 1, for the purpose of assisting understanding of the object and the effect of the present invention, a configuration and a problem according to a comparative example shown in FIG. 2 will be first described.

Thereafter, returning to FIG. 1 again, the power conversion device according to the first embodiment of the present invention will be described in detail.

<Comparative Example>

As described above, for the purpose of assisting the understanding of the object and the effect of the present invention, the reason why voltage/current oscillations occur is described by describing a configuration and an operation of a power conversion device according to the comparative example.

FIG. 2 is a diagram showing a circuit configuration example of the power conversion device according to the comparative example.

In FIG. 2, a power conversion device 200 according to the comparative example includes a switching element 201 and a rectifier element 202 and a DC voltage (power) is supplied from a voltage source 204 to the power conversion device 200.

In the power conversion device 200, the switching element 201 repeats turning-on and turning-off at a high speed to control power supplied to an inductive load 203 connected in parallel with the rectifier element 202.

In the power conversion device 200 of FIG. 2, an SiC-SBD is used in the rectifier element 202.

The SiC-SBD of the rectifier element 202 has a higher withstand voltage than an Si-pn diode using Si as a semiconductor substrate by using SiC as the semiconductor substrate and can realize an element having the same withstand voltage with a thickness of about ⅒. As a result, a conduction loss of the rectifier element 202 can be reduced.

Therefore, by using the SiC-SBD, the power conversion device 200 can suppress a recovery current generated in the rectifier element 202 when the switching element 201 is turned on, as compared with the case where the Si-pn diode is used as the semiconductor substrate in the rectifier element 202. As a result, a recovery loss of the rectifier element 202 and a turn-on loss of the switching element 201 can be reduced.

In the power conversion device of FIG. 2, an Si-IGBT is used in the switching element 201.

A gate terminal of the switching element 201 is connected to a drive signal source 205. A potential $V_g$ of the gate terminal based on the potential of an emitter terminal of the switching element 201 changes due to a voltage generated by the drive signal source 205.

When the potential (voltage) $V_g$ is smaller than a threshold voltage $V_{th}$ to be a voltage value peculiar to the switching element 201, the switching element 201 is turned off and a resistance value between a collector terminal and the emitter terminal thereof is large.

On the other hand, when the potential $V_g$ is larger than the threshold voltage $V_{th}$, the switching element 201 is in an on state, and the resistance value between the collector terminal and the emitter terminal thereof is small.

«Voltage/Current Waveforms of Each Unit of Power Conversion Device According to Comparative Example»

FIGS. 3(a) to 3(c) are diagrams showing voltage/current waveforms of each unit of a circuit when the switching element 201 is switched from an off state to an on state in the power conversion device 200 according to the comparative example shown in FIG. 2, wherein FIG. 3(a) shows a gate potential $V_g$ of the switching element 201, FIG. 3(b) shows a collector potential (voltage) $V_s$ and a flowing current $I_s$ of the switching element 201, and FIG. 3(c) shows a voltage $V_d$ applied to the rectifier element 202 and a flowing current $I_d$.

In addition, in FIGS. 3(a), 3(b), and 3(c), a vertical axis shows a voltage (potential) or a current and a horizontal axis shows time or a transition of time (t).

At time $t_0$, as shown in FIG. 3(a), the gate potential $V_g$ of the switching element 201 (FIG. 2) is equal to a value $V_{off}$ smaller than the threshold voltage $V_{th}$. That is, the switching element 201 is in an off state.

Therefore, the current $I_s$ flowing through the switching element 201 is approximately zero as shown in FIG. 3(b) and the voltage $V_s$ held by the switching element 201 is approximately equal to a power supply voltage $V_{cc}$.

In addition, because a current $I_0$ flowing through the inductive load 203 at the time $t_0$ is returned through the rectifier element 202, the current $I_d$ flowing through the rectifier element 202 is approximately equal to $I_0$ as shown in FIG. 3(c) and the voltage $V_d$ held by the rectifier element 202 is approximately zero.

At time $t_1$, as shown in FIG. 3(a), the gate potential $V_g$ of the switching element 201 is switched from $V_{off}$ to a value $V_{on}$ larger than $V_{th}$.

According to this, although there is a slight time difference, the switching element 201 transits from an off state to an on state (that is, it is turned on) and the resistance between the collector terminal and the emitter terminal changes from a high resistance to a low resistance.

As a result, as shown in FIG. 3(b), the collector potential (voltage) $V_s$ of the switching element 201 decreases and the current $I_s$ increases. On the other hand, the rectifier element 202 changes from a forward bias state to a reverse bias state (that is, it recovers) according to turning-on of the switching element 201 and as shown in FIG. 3(c), the voltage $V_d$ held by the rectifier element 202 Increases and the current $I_d$ decreases.

As shown in FIGS. 3(b) and 3(c), when the switching element 201 is turned on and the rectifier element 202 recovers, large oscillation components are transiently superimposed on $I_s$, $V_d$, and $I_d$.

Due to waveform oscillations of $I_s$, $V_d$, and $I_d$, for example, a voltage exceeding the withstand voltage of the element may be generated to destroy the element.

Figure 3:
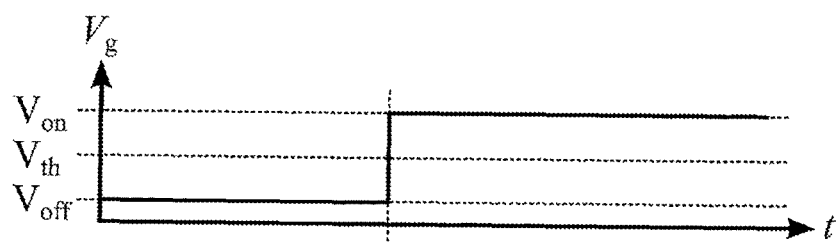
Figure 3:
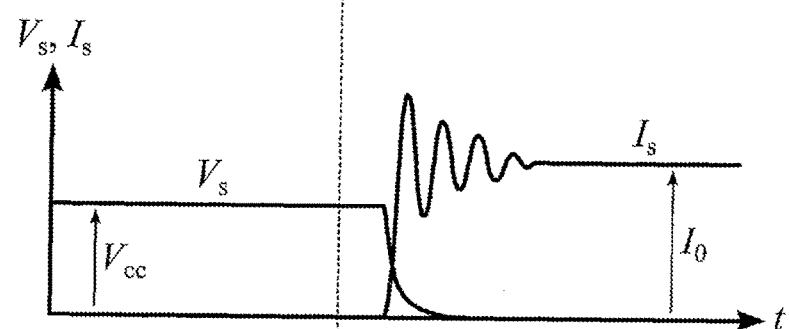
Figure 3:
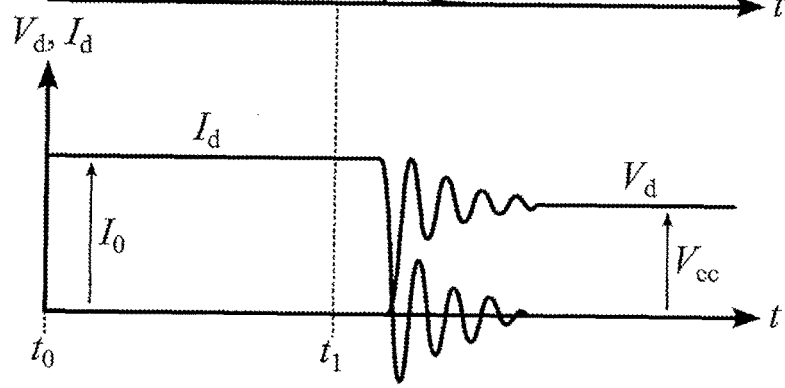

In addition, the waveform oscillations may cause inductive disturbance to interfere with a normal operation of the power conversion device 200 of FIG. 2 or other electric apparatus located in the vicinity of the power conversion device 200 of FIG. 2. From the above reason, the waveform oscillations shown in FIG. 3 are undesirable.

«Factors of Waveform Oscillations»

Next, factors causing the waveform oscillations described above will be described with reference to FIG. 4.

Figure 4:
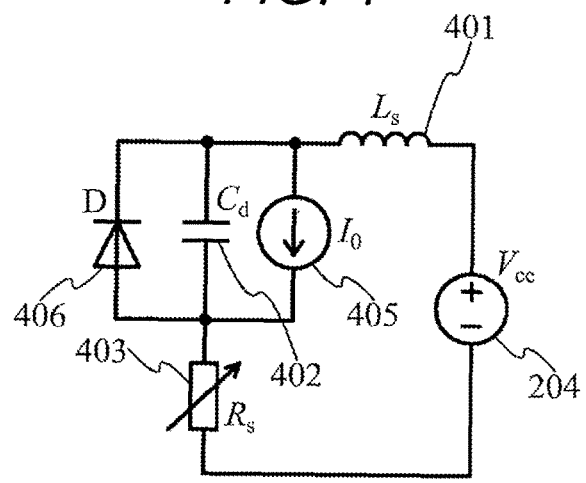
FIG. 4 is a diagram showing an equivalent circuit when the switching element is turned on in the power conversion device of FIG. 2 and oscillations are generated in $I_s$, $V_d$, and $I_d$ shown in FIGS. 3(a) to 3(b).

FIG. 4 is a diagram showing an equivalent circuit when the switching element 201 is turned on in the power conversion device of FIG. 2 and oscillations occur generated in $I_s$, $V_d$, and $I_d$ shown in FIGS. 3(a) to 3(c).

In FIG. 4, a variable resistor 403 represents the switching element 201 (FIG. 2). That is, turning-on of the switching element 201 is represented by that a resistance value of the variable resistor 403 changes from a high resistance to a low resistance in FIG. 4.

In addition, in FIG. 4, a parallel circuit of a junction capacitance 402 and an ideal diode 406 represents the rectifier element 202 (FIG. 2). The junction capacitance 402 represents a junction capacitance which the rectifier element 202 has in a reverse bias state.

In addition, in FIG. 4, a current source 405 represents the current $I_0$ flowing through the inductive load 203 (FIG. 2) on the assumption that the current has a constant value. Assuming that an inductance of the inductive load 203 is sufficiently larger than a parasitic inductance 401 described later, the current $I_0$ can be regarded as the constant value and therefore can be expressed as a current source 405.

In addition, in FIG. 4, the parasitic inductance 401 is connected in series with the voltage source 204. Although not shown in FIG. 2, the parasitic inductance 401 inevitably exists because an electric wiring line has a finite volume mainly, in the actual power conversion device.

Although the actual parasitic inductance exists in the entire circuit in a distributed manner, in FIG. 4, the parasitic inductance 401 represents the actual parasitic inductance in a representative manner.

As shown in FIG. 4, the variable resistor 403, the junction capacitance 402, and the parasitic inductance 401 form a series circuit, resonance occurs between the junction capacitance 402 and the parasitic inductance 401 according to conditions, and the voltage/current oscillates.

As described above, the resistance value of the variable resistor 403 changes from a high resistance to a low resistance according to turning-on of the switching element 201.

At this time, if a change speed is fast, oscillation energy transiently accumulated in the parasitic inductance 401 and the junction capacitance 402 cannot be immediately consumed by the variable resistor 403 and the voltage and the current oscillate (transient oscillations).

That is, the oscillation energy is gradually consumed by the variable resistor 403 while being repeatedly exchanged between the parasitic inductance 401 and the junction capacitance 402.

On the other hand, when the change speed is slow, the oscillation energy transiently accumulated in the parasitic inductance 401 and the junction capacitance 402 is successively consumed by the variable resistor 403 and the oscillation does not occur.

From the above, it is effective to delay the change speed of the resistance value of the switching element 201 to prevent the waveform oscillations when the switching element 201 is turned on.

When the switching element 201 (FIG. 2) is turned on, the current $I_s$ flowing through the switching element 201 increases as the resistance value of the switching element 201 decreases (FIG. 3(b)). From this, the change speed of the resistance value of the switching element 201 can be evaluated by a change rate dI/dt of the current $I_s$ flowing through the switching element 201, that is, $dI_s/dt$.

The switching element 201 is an Si-IGBT and is an active semiconductor element including an insulated gate terminal of a MOS structure in a part thereof.

As such, because the IGBT has the MOS structure, the current change rate dI/dt of the switching element 201 is represented by a product of a transconductance gm of the switching element 201 and a time change rate $dV_g/dt$ of the gate voltage (potential) $V_g$.

From this, it can be seen that the transconductance gm of the switching element 201 may be reduced to reduce dI/dt.

From the above description, it is concluded that it is effective to reduce the transconductance gm of the switching element 201 to prevent the waveform oscillations when the switching element 201 is turned on, in the power conversion device 200 shown in FIG. 2.

In view of this conclusion, the present invention specifically provides a structure and a drive method of a switching element capable of reducing the transconductance gm and provides a power conversion device that prevents waveform oscillations while using an SiC-SBD in a rectifier element, as characteristics thereof.

«First Embodiment: Second Part»

The description returns to the description of the first embodiment of the present invention. The power conversion device according to the first embodiment will be described in detail with reference to FIGS. 1, 5, and 6(a) to 6(d).

«Circuit Configuration of Power Conversion Device»

As described above, FIG. 1 is a diagram showing a configuration example of the power conversion device according to the first embodiment of the present invention.

In FIG. 1, the power conversion device 100 is configured such that the power conversion device 100 includes the switching element (IGBT) 101 having the first gate terminal 105 and the second gate terminal 106 and the rectifier element (for example, SiC-Schottky barrier diode (SiC-SBD)) 102 to be a diode having a Schottky junction and the external electric load (for example, an inductive load) 103 is connected.

The switching element 101 and the rectifier element 102 are connected in series with each other and both ends thereof are connected to the voltage source 104. In addition, a connection point of the switching element 101 and the rectifier element 102 is connected to the electric load (inductive load) 103.

In addition, the power conversion device 100 has a configuration in which power is supplied from the voltage source 104 and the switching element 101 repeats turning-on and turning-off at a high speed to control power supplied to the electric load (inductive load) 103.

Although the "electric load (inductive load) 103" is expressed, an example suitable as the electric load 103 externally connected to the power conversion device according to the present invention is an inductive load such as a motor. However, the present invention is not limited to a configuration in which the inductive load is connected as the electric load 103 and a configuration in which other electric load (for example, a resistive load including an inductive component regardless of the magnitude thereof) including the inductive component is connected is also included in a range of the present invention.

In addition, the switching element 101 of FIG. 1 is composed of an insulated gate semiconductor element (IGBT) and includes the first gate terminal 105 and the second gate terminal 106, which are driven by different drive signal sources 107 and 108, respectively.

A potential $V_{g1}$ of the first gate terminal based on the potential of the emitter terminal of the switching element 101 and a potential $V_{g2}$ of the second gate terminal based on the potential of the emitter terminal of the switching element 101 are changed by the voltages generated by the drive signal sources 107 and 108, respectively.

When the potential $V_{g1}$ of the first gate terminal is smaller than a first threshold voltage $V_{th1}$ to be a voltage value peculiar to the switching element 101 and the potential $V_{g2}$ of the second gate terminal is smaller than a second threshold voltage $V_{th2}$ to be a voltage value peculiar to the switching element 101, the switching element 101 enters an off state ($t_0$ to $t_1$ in FIGS. 6(a) to 6(d) to be described later).

In addition, when the potential $V_{g1}$ of the first gate terminal is larger than $V_{th1}$ and the potential $V_{g2}$ of the second gate terminal is smaller than $V_{th2}$, the switching element 101 enters a first on state ($t_1$ to $t_2$ in FIGS. 6(a) to 6(d) to be described later).

In addition, when the potential $V_{g1}$ of the first gate terminal is larger than $V_{th1}$ and the potential $V_{g2}$ of the second gate terminal is larger than $V_{th2}$, the switching element 101 enters a second on state (at and after $t_2$ in FIGS. 6(a) to 6(d) to be described later).

<Cross-sectional Structure of IGBT having Two Gate Terminals>

Figure 5:
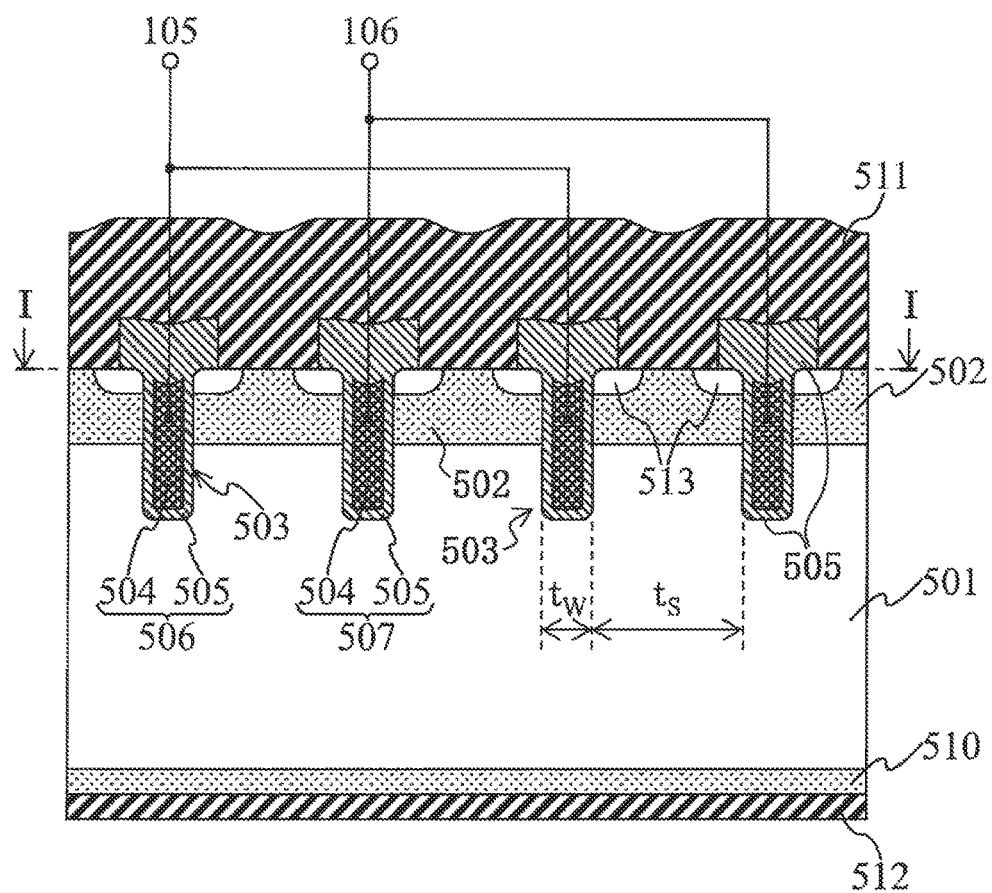
FIG. 5 is a diagram schematically showing an example of a cross-sectional structure of an insulated gate semiconductor element having two insulated gate terminals shown in FIG. 1.

FIG. 5 is a diagram schematically showing an example of a cross-sectional structure of the insulated gate semiconductor element (IGBT) 101 having two gate terminals (insulated gate terminals) shown in FIG. 1.

In FIG. 5, a p-type (second-conductive-type) channel layer 502 (second semiconductor layer) is formed on a surface (first surface) of one side (upper side of a plane of paper) of a drift layer 501 (first semiconductor layer) formed of an n-type (first-conductive-type) semiconductor and a p-type collector layer 510 (fourth semiconductor layer) is formed on a surface (second surface) of the other side (lower side of the plane of paper).

A plurality of trenches 503 having a groove structure penetrating the channel layer 502 from a surface of the channel layer 502 not contacting the drift layer 501 and reaching the drift layer 501 are formed.

As shown in FIG. 5, a width of the trench 503 is $t_w$ and an interval between the trenches 503 adjacent to each other is $t_s$.

In the trench 503, gate electrodes (insulated gate electrodes) 506 and 507 configured to include a conductor 504 formed in the trench 503 and an insulating film 505 formed around the conductor 504 are formed.

On the surface of the p-type channel layer 502 not contacting the drift layer 501, an n-type source region 513 (third semiconductor layer) is formed in an island shape to be adjacent to the insulating film 505.

On the surface of the p-type channel layer 502 not contacting the drift layer 501 and the surface of the n-type source region 513, an emitter electrode 511 is formed of a conductor.

A collector electrode 512 is formed on the surface of the p-type collector layer 510 not contacting the drift layer 501.

In addition, in FIG. 5, the first gate terminal 105 and the second gate terminal 106 are schematically shown.

The first gate terminal 105 and the second gate terminal 106 are connected to the plurality of gate electrodes 506 and 507, respectively. That is, the first gate electrode 506 is connected to the first gate terminal 105 and the second gate electrode 507 is connected to the second gate terminal 106.

Connection of the first gate terminal 105 and the first gate electrode 506 and connection of the second gate terminal 106 and the second gate electrode 507 are schematically shown in FIG. 5.

A practical structure of the connection of the first gate terminal 105 and the first gate electrode 506 and the connection of the second gate terminal 106 and the second gate electrode 507 will be described again in FIG. 9 to be described later.

To electrically separate the conductor for connecting the first gate terminal 105 and the first gate electrode 506 and connecting the second gate terminal 106 and the second gate electrode 507 and the emitter electrode 511, the insulating film 505 is formed to a height (the upper side of the plane of paper) at which the emitter electrode 511 is shown in FIG. 5.

An example of a plan view when the side (lower side of the plane of paper) of the drift layer 501 is viewed from a cross-section taken along I-I in FIG. 5 corresponds to FIG. 9 to be described later.

《Voltage/Current Waveforms of Each Unit of Power Conversion Device According to First Embodiment》

Figure 6:
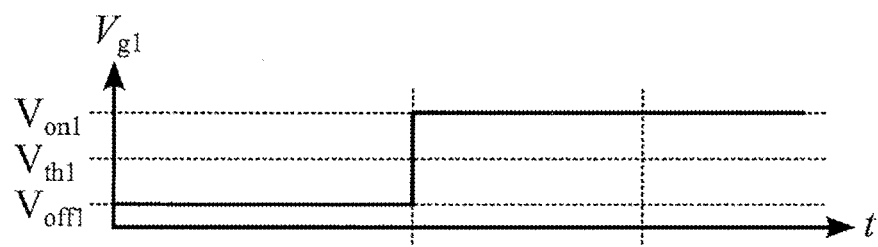
Figure 6:
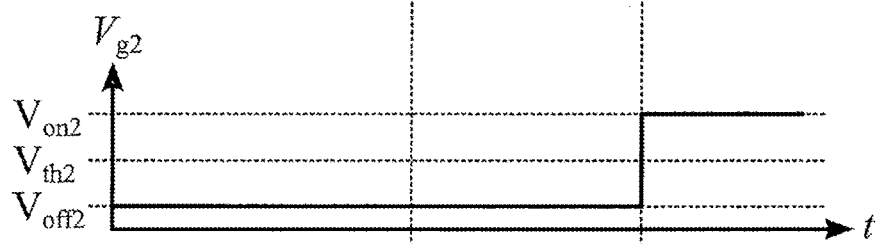
Figure 6:
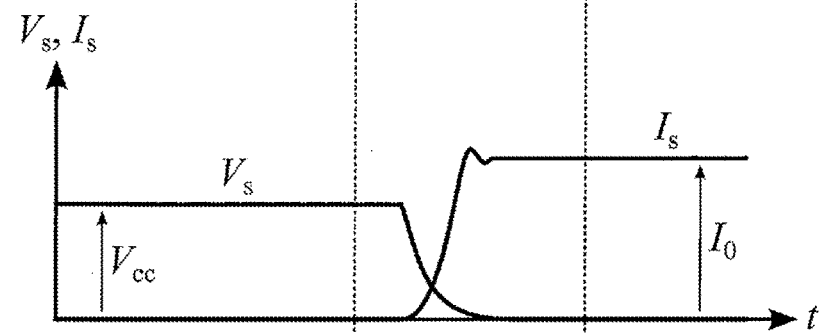
Figure 6:
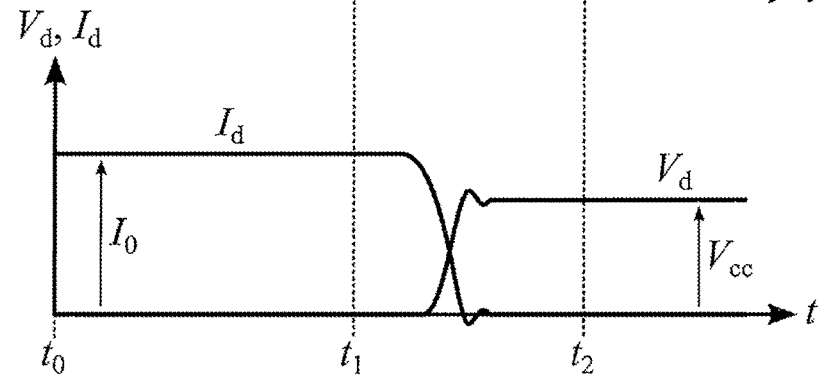

FIGS. 6(a) to 6(d) are diagrams showing voltage/current waveforms of each unit of a circuit when the switching element 101 (FIG. 1) is switched from an off state to an on state in the power conversion device according to the first embodiment of the present invention, wherein FIG. 6(a) shows the potential $V_{g1}$ of the first gate electrode 506 (first gate terminal 105) of the switching element 101, FIG. 6(b) shows the potential $V_{g2}$ of the second gate electrode 507 (second gate terminal 106) of the switching element 101, FIG. 6(c) shows the collector potential (voltage) $V_s$ of the switching element 101 and the flowing current $I_s$, and FIG. 6(d) shows the voltage $V_d$ applied to the rectifier element 102 and the flowing current $I_d$.

In addition, in FIGS. 6(a), 6(b), 6(c), and 6(d), a vertical axis shows a voltage (potential) or a current and a horizontal axis shows a time or a transition of time (t).

At time $t_0$, as shown in FIGS. 6(a) and 6(b), the potential $V_{g1}$ of the first gate electrode 506 is equal to a value $V_{off1}$ smaller than the first threshold voltage $V_{th1}$ and the potential $V_{g2}$ of the second gate electrode 507 is equal to a value $V_{off2}$ smaller than the second threshold voltage $V_{th2}$.

That is, the switching element 101 (FIG. 1) is in an off state. Therefore, as shown in FIG. 6(c), the current $I_s$ flowing through the switching element 101 is approximately zero and the voltage $V_s$ held by the switching element 101 is approximately equal to a power supply voltage $V_{cc}$.

In addition, because a current $I_0$ flowing through the inductive load 103 at the time $t_0$ is returned through the rectifier element 102, as shown in FIG. 6(d), the current $I_d$ flowing through the rectifier element 102 is approximately equal to $I_0$ and the voltage $V_d$ held by the rectifier element 102 is approximately zero.

At time $t_1$, as shown in FIGS. 6(a) and 6(b), the potential $V_{g1}$ of the first gate electrode 506 is switched from $V_{off1}$ to a value $V_{on1}$ larger than the first threshold voltage $V_{th1}$. According to this, the switching element 101 transits (it is turned on) from an off state to a first on state.

As a result, as shown in FIG. 6(c), the voltage Vs decreases and the current $I_s$ increases. On the other hand, as shown in FIG. 6(d), the rectifier element 102 transits (recovers) from a forward bias state to a reverse bias state according to turning-on of the switching element 101, the voltage $V_d$ increases, and the current $I_d$ decreases.

At time $t_2$, as shown in FIG. 6(c), the transient changes of the voltage/current in the switching element 101 and the rectifier element 102 have already ended. That is, because the switching element 101 is in the first on state and the current $I_0$ flowing through the inductive load 103 flows through the switching element 101, the current $I_s$ is approximately equal to $I_0$ and the voltage $V_s$ is approximately zero.

In addition, as shown in FIG. 6(d), because the rectifier element 102 is in the reverse bias state, the current $I_d$ is approximately zero and the voltage $V_d$ is approximately equal to the power supply voltage $V_{cc}$.

In addition, as shown in FIG. 6(b), in this state, the potential $V_{g2}$ of the second gate electrode 506 (the second gate terminal 106) is switched from $V_{off2}$ to a value $V_{on2}$ larger than the second threshold voltage $V_{th2}$. According to this, the switching element 101 transits from the first on state to the second on state.

«Reason why Waveform Oscillations do not Occur in Power Conversion Device According to First Embodiment»

As described above, in the process shown in FIGS. 6(a) to 6(d) in which the switching element 101 is switched from the off state to the on state, large oscillation components are not superimposed on $I_s$, $V_d$, and $I_d$.

In the power conversion device according to the first embodiment of the present invention, the reason why the waveform oscillations do not occur is described as follows.

As shown in FIG. 5, in the switching element 101 (FIG. 1), only the first gate electrode 506 to be a part of the plurality of gate electrodes formed in the switching element 101 is connected to the first gate terminal 105.

Therefore, when the switching element 101 is in the first on state, an inversion layer is formed only in a region included in the p-type channel layer 502 and located in the vicinity of the first gate electrode 506, whereas the inversion layer is not formed in a region included in the p-type channel layer 502 and located in the vicinity of the second gate electrode 507.

For example, when a ratio of the number of first gate electrodes 506 to the number of second gate electrodes 507 is 1:1, an area through which a current of the inversion layer formed when the switching element 101 is in the first on state flows is half an area through which the current of the inversion layer formed when the switching element 101 is in the second on state flows.

When the switching element 101 is in the first on state, electrons are injected into the n-type drift layer 501 from the n-type source region 513 (FIG. 5) connected to the inversion layer via the inversion layer.

Then, in response to the electrons, holes are injected into the n-type drift layer 501 from the p-type collector layer 510.

In this way, the electrons and the holes injected into the n-type drift layer 501 function as carriers, and the switching element 101 becomes conductive.

However, as described above, the area of the inversion layer formed when the switching element 101 is in the first on state is smaller than the area of the inversion layer formed when the switching element 101 is in the second on state. As a result, the current flowing when the switching element 101 is in the first on state becomes smaller than the current flowing when the switching element 101 is in the second on state.

That is, the transconductance gm1 when the switching element 101 transits from the off state to the first on state is smaller than the transconductance gm2 when the switching element 101 transits from the off state to the second on state.

Therefore, with the power conversion device according to the first embodiment of the present invention, it is possible to suppress the voltage/current oscillations while using the SiC-SBD in the rectifier element 102.

Because the transient changes in the voltage/current of the switching element 101 and the rectifier element 102 have already ended at time $t_2$, the waveform oscillations do not occur even if the switching element 101 is transited from the first on state to the second on state at this point of time.

On the other hand, in the second on state, the amount of carriers injected into the n-type drift layer 501 is larger than that in the first on state and as a result, an on voltage of the switching element 101 is small.

Therefore, from the viewpoint of reducing a conduction loss of the switching element 101, if the transient changes of the voltage/current end after the switching element 101 is transited from the off state to the first on state at the time $t_1$, it is desirable to promptly transit the state to the second on state.

<Effect of First Embodiment>

From the above, the power conversion device 100 according to the first embodiment becomes a power conversion device that can suppress the voltage/current oscillations (transient oscillations) while using the SiC-SBD in the rectifier element 102 having characteristics of a high withstand voltage and a low recovery loss.

That is, the power conversion device 100 becomes a power conversion device that has characteristics of a high withstand voltage and a low recovery loss.

«Second Embodiment»

A power conversion device according to a second embodiment of the present invention will be described with reference to FIG. 7.

Figure 7:
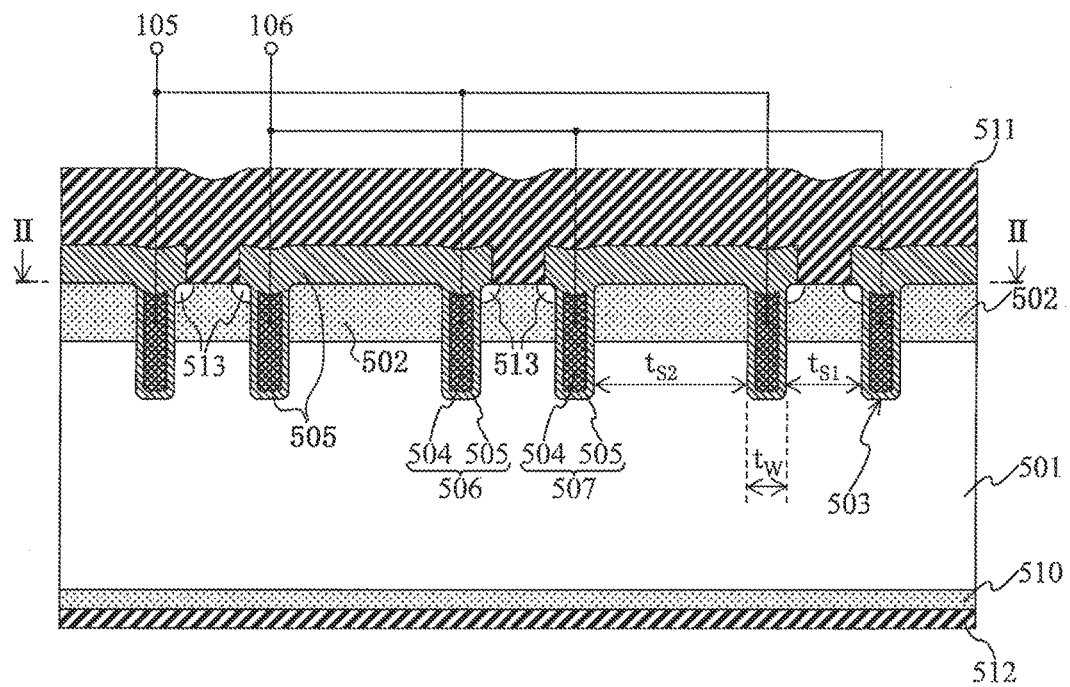
FIG. 7 is a diagram schematically showing an example of a cross-sectional structure of a switching element used in a power conversion device according to a second embodiment of the present invention.

FIG. 7 is a diagram schematically showing an example of a cross-sectional structure of a switching element 101 (FIG. 1) used in the power conversion device according to the second embodiment of the present invention.

In FIG. 7, a plurality of trenches 503 are formed as sets of two trenches adjacent to each other. In addition, a pair of the two trenches 503 adjacent to each other with an n-type source region 513 therebetween is expressed as "belonging to the same set".

An interval ($t_{S1}$) of two trenches belonging to the same set with the n-type source region 513 therebetween is smaller than an interval ($t_{S2}$) of two trenches belonging to the sets of trenches adjacent to each other and not belonging to the same set.

In the two trenches belonging to the same set, a first gate electrode 506 is formed on one side and a second gate electrode 507 is formed on the other side. In addition, as described above, the n-type source region 513 is formed between the two trenches belonging to the same set.

A surface of a p-type channel layer 502 between the two trenches belonging to the sets of trenches adjacent to each other and adjacent to each other is covered by an insulating film 505.

An example of a plan view when the side (lower side of a plane of paper) of a drift layer 501 is viewed from a cross-section taken along II-II in FIG. 7 corresponds to FIG. 10 to be described later. Because the other elements and configurations are the same as those in FIG. 5, duplicate description is omitted.

A structure of the switching element according to the second embodiment shown in FIG. 7 has an effect of reducing an on voltage of the switching element 101 (FIG. 1).

The reason is that a contact area between the p-type channel layer 502 and an emitter electrode 511 in FIG. 7 is smaller than that in the first embodiment shown in FIG. 5. Specifically, in FIG. 5, an interval $t_S$ of a plurality of places is the same, whereas in FIG. 7 the interval $t_{S1}$<the interval $t_{S2}$ is set.

That is, holes injected into the n-type drift layer 501 from the p-type collector layer 510 at the time of conduction are discharged to the emitter electrode 511 via the p-type channel layer 502. At this time, in the structure shown in FIG. 7, because the contact area between the p-type channel layer 502 and the emitter electrode 511 is smaller than that in FIG. 5, it is difficult for the holes to be discharged and a density of the holes accumulated in the n-type drift layer 501 becomes high. As a result, the number of carriers contributing to the movement of a current increases, an equivalent resistance decreases, and the on-voltage can be reduced.

«Third Embodiment»

A power conversion device according to a third embodiment of the present invention will be described with reference to FIG. 8.

Figure 8:
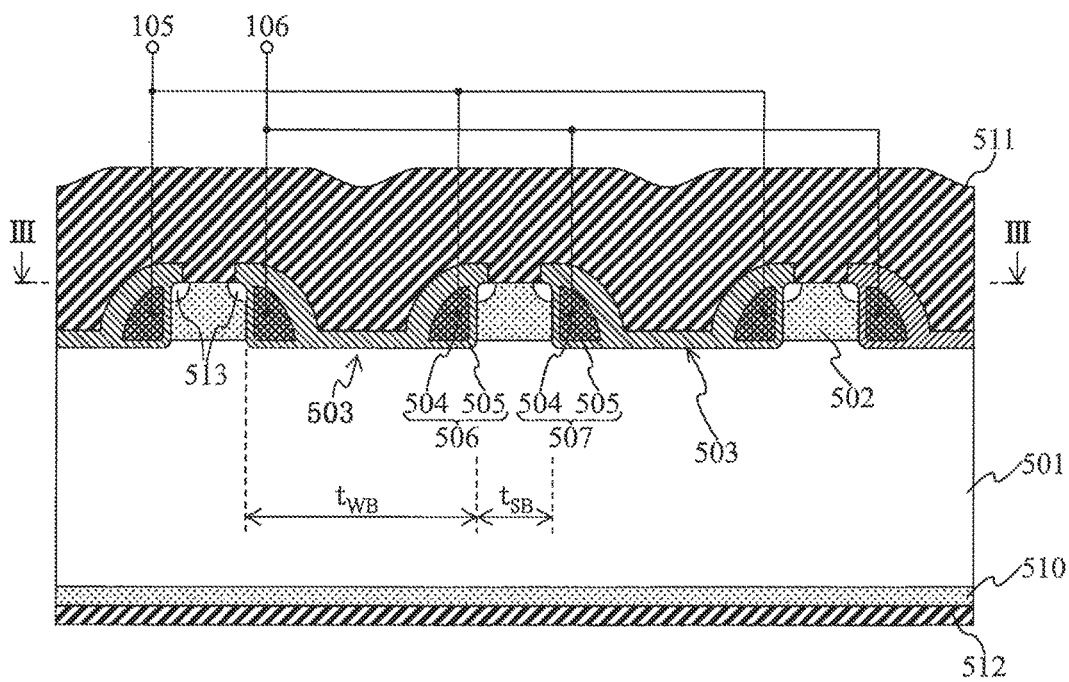
FIG. 8 is a diagram schematically showing an example of a cross-sectional structure of a switching element used in a power conversion device according to a third embodiment of the present invention.

FIG. 8 is a diagram schematically showing an example of a cross-sectional structure of a switching element 101 (FIG. 1) used in the power conversion device according to the third embodiment of the present invention.

The structure shown in FIG. 8 is realized by inserting a process for forming a conductor 504 after forming a trench 503 and removing the conductor 504 with a side surface of the trench 503 left selectively using anisotropy.

In the structure of FIG. 8, an n-type source region 513 and a channel layer 502 are formed to be located outside the trenches 503 and to exist between the trenches 503 adjacent to each other and are controlled by gate electrodes 506 and 507 formed in the trenches 503.

In addition, in FIG. 8, a width ($t_{WB}$) of the trench 503 is larger than an interval ($t_{SB}$) of the trenches adjacent to each other.

As described above, one first gate electrode 506 and one second gate electrode 507 are formed to contact different sidewalls of the trench 503 with respect to one wide trench 503.

In addition, a bottom portion of the trench between the first gate electrode 506 and the second gate electrode 507 is covered by an insulating film 505.

Even in this (third) embodiment, as described above, there is a relation of ($t_{SB}$<$t_{WB}$) and similarly to the second embodiment, an contact area between the p-type channel layer 502 and an emitter electrode 511 is small. Therefore, it is possible to obtain an effect of reducing an on voltage.

Furthermore, in this (third) embodiment, an area in which the conductors 504 included in the gate electrodes 506 and 507 face a semiconductor layer including an n-type drift layer 501, the p-type channel layer 502, and the n-type source region 513 is small. As a result, it is possible to obtain an effect of reducing feedback capacitances of the gate terminals (105 and 106) with respect to the channel layer 502 and the source region 513.

«Fourth Embodiment»

A power conversion device according to a fourth embodiment of the present invention will be described with reference to FIG. 9.

Figure 9:
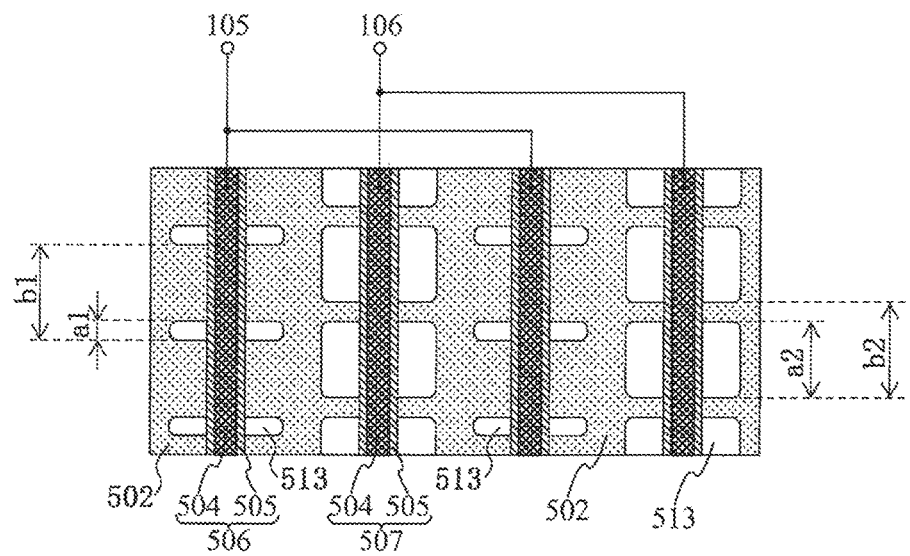
FIG. 9 is a diagram schematically showing an example of a planar structure of a switching element used in a power conversion device according to a fourth embodiment of the present invention.

FIG. 9 is a diagram schematically showing an example of a planar structure of a switching element 101 (FIG. 1) used in the power conversion device according to the fourth embodiment of the present invention.

More specifically, FIG. 9 corresponds to a schematic view when the switching element 101 having the cross-sectional structure shown in FIG. 5 is viewed from a planar direction where the side (a depth direction of a trench and the lower side of a plane of paper) of a drift layer 501 is viewed from a cross-section taken along I-I in FIG. 5.

In FIG. 9, a direction orthogonal to a width direction of the trench is referred to as a depth direction (depth direction from the front side of the plane of paper in FIG. 5) or an extension direction and an arrangement of n-type source regions 513 in the extension direction (depth direction) of a trench 503 is shown.

In FIG. 9, in the extension direction of the trench 503, the n-type source regions 513 are intermittently and repeatedly arranged.

In the extension direction of the trench 503, a ratio of a length of the n-type source region 513 to a length of a repetition unit of the p-type channel layer 502 including the n-type source region 513 is defined as an intermittent ratio.

However, in FIG. 9, an intermittent ratio of the n-type source region 513 adjacent to a first gate electrode 506 (first gate terminal 105) is different from an intermittent ratio of the n-type source region 513 adjacent to a second gate electrode 507 (second gate terminal 106).

A length of the depth direction of the n-type source region 513 (third semiconductor layer) adjacent to the first gate electrode 506 (first gate terminal 105) is a1. In addition, a length of the repetition unit of the depth direction of the p-type channel layer 502 (second semiconductor layer) including the n-type source region 513 (third semiconductor layer) is b1. At this time, an intermittent ratio of the n-type source region 513 adjacent to the first gate electrode 506 (first gate terminal 105) is (a1/b1).

In addition, a length of the depth direction of the n-type source region 513 (third semiconductor layer) adjacent to the second gate electrode 507 (second gate terminal 106) is a2. In addition, a length of the repetition unit of the depth direction of the p-type channel layer 502 (second semiconductor layer) including the n-type source region 513 (third semiconductor layer) is b2. At this time, an intermittent ratio of the n-type source region 513 adjacent to the second gate electrode 507 (second gate terminal 106) is (a2/b2).

In FIG. 9, (a1/b1) is different from and smaller than (a2/b2).

By the structure of FIG. 9, in this (fourth) embodiment, it is possible to obtain an effect in which voltage/current oscillations (transient oscillations) are less likely to occur, as compared with the first to third embodiments.

That is, in the switching element 101 according to this (fourth) embodiment, because the intermittent ratio of the n-type source region 513 adjacent to the first gate electrode 506 is small, an injection amount of electrons when the switching element 101 enters a first on state further decreases (as compared with the case of a1/b1=a2/b2).

As a result, a transconductance gm when the switching element 101 transits from an off state to the first on state becomes smaller and oscillations (transient oscillations) are difficult to occur.

«Fifth Embodiment»

A power conversion device according to a fifth embodiment of the present invention will be described with reference to FIG. 10.

Figure 10:
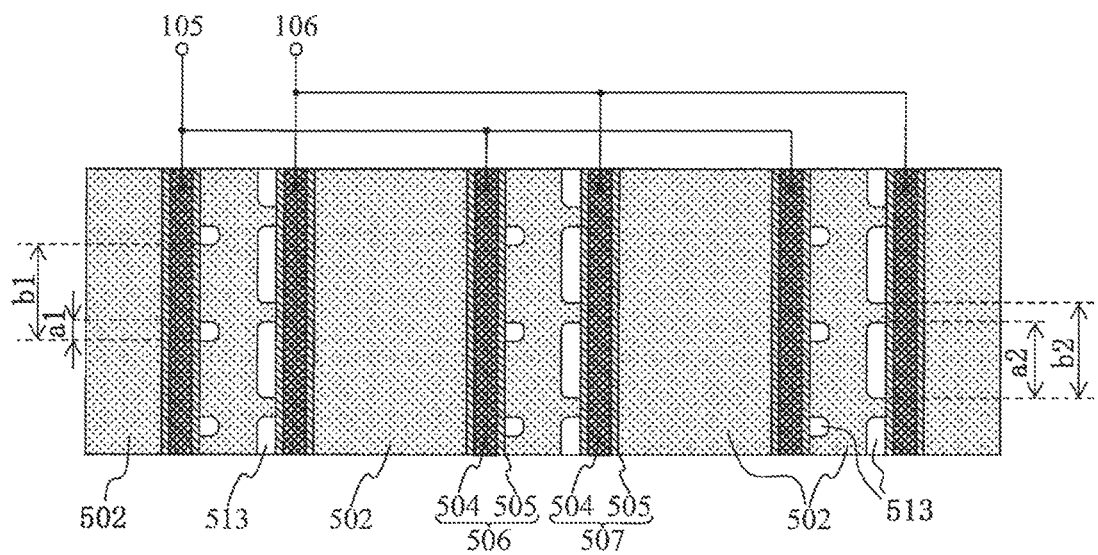
FIG. 10 is a diagram schematically showing an example of a planar structure of a switching element used in a power conversion device according to a fifth embodiment of the present invention.

FIG. 10 is a diagram schematically showing an example of a planar structure of a switching element 101 (FIG. 1) used in the power conversion device according to the fifth embodiment of the present invention.

More specifically, FIG. 10 corresponds to a schematic view when the side (lower side of a plane of paper) of a drift layer 501 is viewed from a cross-section taken along II-II in FIG. 7 in the switching element 101 having the cross-sectional structure shown in FIG. 7. In FIG. 10, an arrangement of n-type source regions 513 in an extension direction (depth direction from the front side of the plane of paper in FIG. 7) of a trench 503 is shown.

In FIG. 10, the n-type source regions 513 in the extension direction (depth direction) of the trench 503 are intermittently and repeatedly arranged.

Even in FIG. 10, a length of the depth direction of the n-type source region 513 adjacent to a first gate electrode 506 (first gate terminal 105) is a1. In addition, a length of a repetition unit of the depth direction of a p-type channel layer 502 including the n-type source region 513 is b1. At this time, an intermittent ratio of the n-type source region 513 adjacent to the first gate electrode 506 (first gate terminal 105) is (a1/b1).

In addition, a length of the depth direction of the n-type source region 513 adjacent to a second gate electrode 507 (second gate terminal 106) is a2. In addition, a length of the repetition unit of the p-type channel layer 502 including the n-type source region 513 is b2. At this time, an intermittent ratio of the n-type source region 513 adjacent to the second gate electrode 507 (second gate terminal 106) is (a2/b2).

In FIG. 10, (a1/b1) is smaller than (a2/b2). By the above, in the fifth embodiment shown in FIG. 10, the same effect as the fourth embodiment shown in FIG. 9 is obtained. Duplicate description is omitted.

«Sixth Embodiment»

A power conversion device according to a sixth embodiment of the present invention will be described with reference to FIG. 11.

Figure 11:
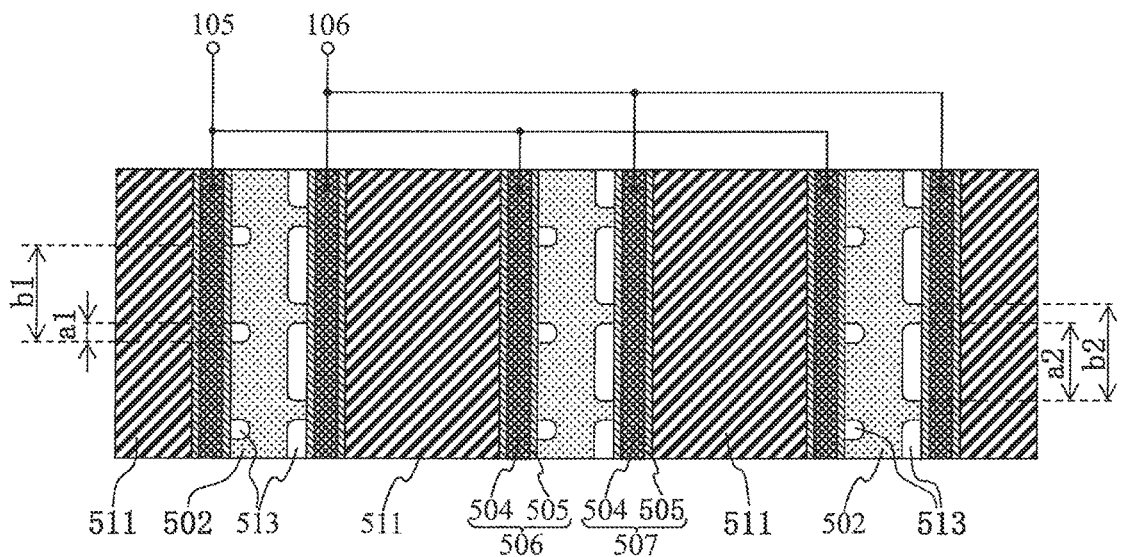
FIG. 11 is a diagram schematically showing an example of a planar structure of a switching element used in a power conversion device according to a sixth embodiment of the present invention.

FIG. 11 is a diagram schematically showing an example of a planar structure of a switching element 101 (FIG. 1) used in the power conversion device according to the sixth embodiment of the present invention.

More specifically, FIG. 11 corresponds to a schematic view when the side (a depth direction of a trench and the lower side of a plane of paper) of a drift layer 501 is viewed from a cross-section taken along III-III in FIG. 8 in the switching element 101 having the cross-sectional structure shown in FIG. 8.

In FIG. 11, a direction orthogonal to a width direction of the trench is referred to as a depth direction (depth direction from the front side of the plane of paper in FIG. 8) or an extension direction and an arrangement of n-type source regions 513 in the extension direction (depth direction) of a trench 503 is shown.

In FIG. 11, in the extension direction of the trench 503, the n-type source regions 513 are intermittently and repeatedly arranged.

Even in FIG. 11, a length of the depth direction of the n-type source region 513 adjacent to a first gate electrode 506 (first gate terminal 105) is a1. In addition, a length of a repetition unit of the depth direction of a p-type channel layer 502 including the n-type source region 513 is b1. At this time, an intermittent ratio of the n-type source region 513 adjacent to the first gate electrode 506 (first gate terminal 105) is (a1/b1).

In addition, a length of the depth direction of the n-type source region 513 adjacent to a second gate electrode 507 (second gate terminal 106) is a2. In addition, a length of a repetition unit of the depth direction of a p-type channel layer 502 including the n-type source region 513 is b2. At this time, an intermittent ratio of the n-type source region 513 adjacent to the second gate electrode 507 (second gate terminal 106) is (a2/b2).

In FIG. 11, (a1/b1) is smaller than (a2/b2). By the above, in the sixth embodiment shown in FIG. 11, the same effect as the fourth embodiment shown in FIG. 9 is obtained. Duplicate description is omitted.

«Seventh Embodiment»

A power conversion device according to a seventh embodiment of the present invention will be described with reference to FIG. 12.

Figure 12:
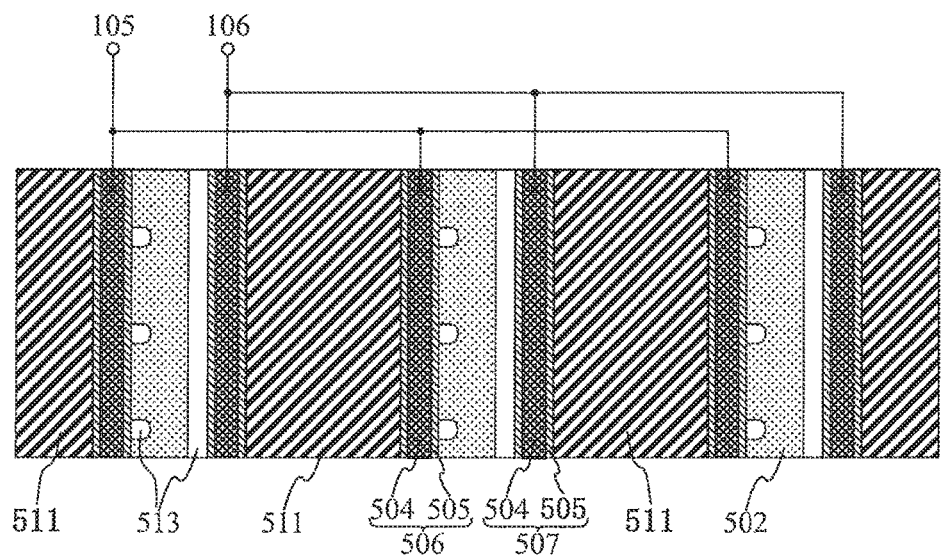
FIG. 12 is a diagram schematically showing an example of a planar structure of a switching element used in a power conversion device according to a seventh embodiment of the present invention.

FIG. 12 is a diagram schematically showing an example of a planar structure of a switching element 101 (FIG. 1) used in the power conversion device according to the seventh embodiment of the present invention.

The seventh embodiment shown in FIG. 12 is an example of the case where an intermittent ratio of an n-type source region 513 adjacent to a second gate electrode 507 is equal to 1.

That is, the n-type source region 513 adjacent to the second gate electrode 507 is continuously arranged in an extension direction of a trench 503.

Even when the intermittent ratio of the n-type source region 513 adjacent to the second gate electrode 507 is equal to 1, while maintaining a voltage/current oscillation suppression effect to be a characteristic of this (seventh) embodiment, an injection amount of electrons when the switching element 101 enters a second on state can be increased and a conduction loss can be reduced.

Duplicate description of the description of the fourth to sixth embodiments is omitted.

«Eighth Embodiment»

A power conversion device according to an eighth embodiment of the present invention will be described with reference to FIGS. 13 and 14.

Figure 13:
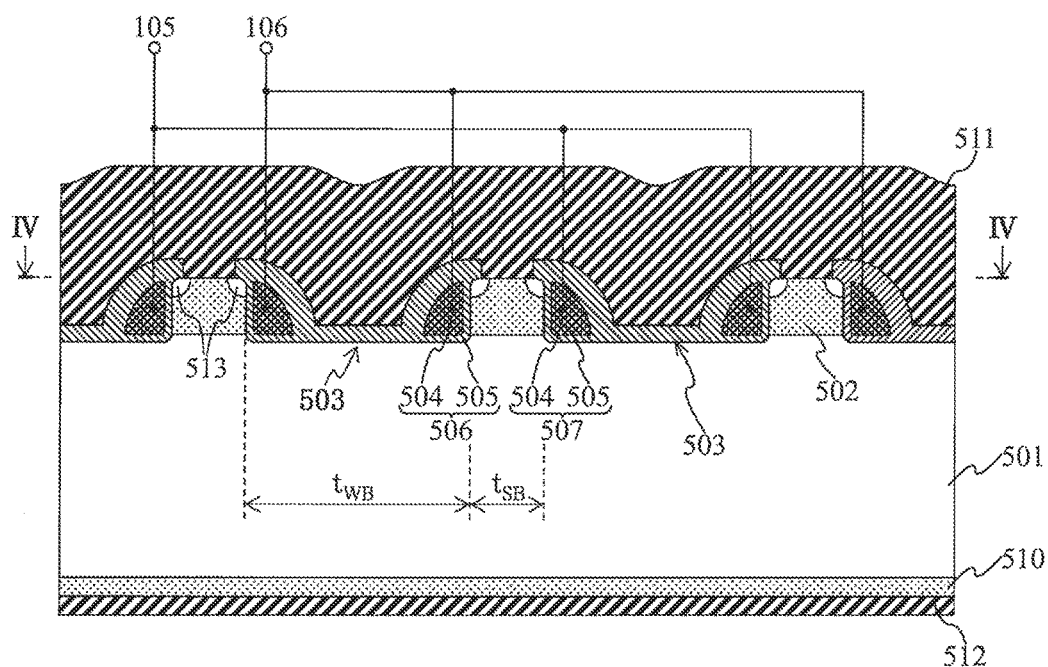
FIG. 13 is a diagram schematically showing an example of a cross-sectional structure of a switching element used in a power conversion device according to an eighth embodiment of the present invention.

FIG. 13 is a diagram schematically showing an example of a cross-sectional structure of a switching element 101 (FIG. 1) used in the power conversion device according to the eighth embodiment of the present invention.

The eighth embodiment shown in FIG. 13 is characterized by an arrangement of a first gate electrode 506 and a second gate electrode 507. That is, two first gate electrodes 506 are formed to contact left and right sidewalls of one wide trench 503 and two second gate electrodes 507 are formed to contact left and right sidewalls of the wide trench 503 adjacent thereto.

Figure 14:
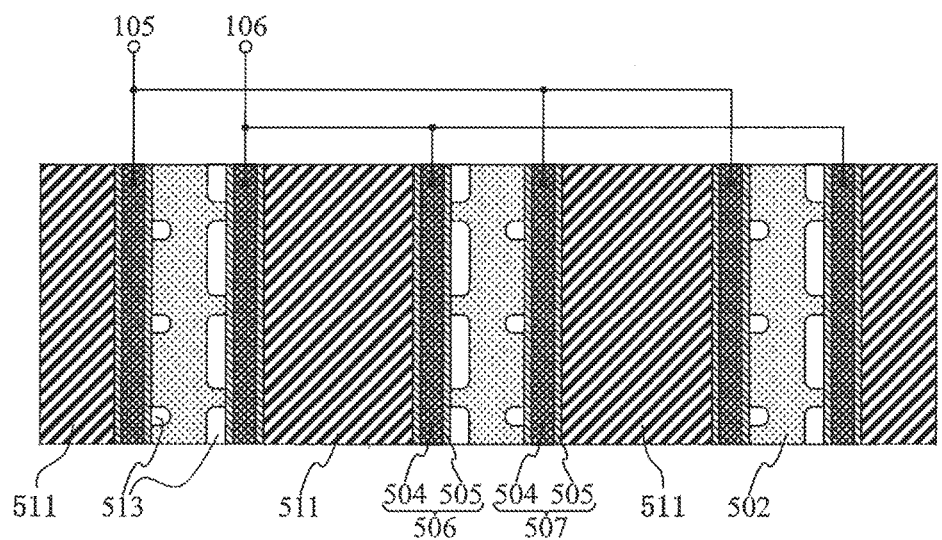
FIG. 14 is a diagram schematically showing an arrangement example of n-type source regions in an extension direction of a trench of a switching element according to the eighth embodiment of the present invention shown in FIG. 13.

A plan view when the side (lower side of a plane of paper) of a drift layer 501 is viewed from a cross-section taken along IV-IV in FIG. 13 is shown in FIG. 14.

FIG. 14 is a diagram schematically showing an arrangement example of n-type source regions 513 of the switching element 101 (FIG. 1) according to the eighth embodiment of the present invention shown in FIG. 13 in an extension direction of the trench 503.

FIG. 13 showing the eighth embodiment is different from FIG. 8 only in a method of connecting a first gate terminal 105 and a second gate terminal 106 to the gate electrodes 506 and 507 and the other configuration is substantially the same. Therefore, an effect of reducing an on voltage or reducing feedback capacitances of the gate terminals is the same as that in the third embodiment of FIG. 8.

Next, a different point and a different effect between the eighth embodiment and the third embodiment will be described.

In FIGS. 13 and 14 showing the eighth embodiment, in the first gate terminal 105, two gate electrodes in one trench 503 are connected to each other. Similarly, in the second gate terminal 106, two gate electrodes in one trench 503 are connected to each other.

In this structure, conductors 504 of the two gate electrodes in one trench 503 are originally formed as one conductor and are then divided by etching. Therefore, as shown in FIGS. 13 and 14, the structure in which the two gate electrodes in one trench 503 are connected to each other is a convenient structure in which manufacturing is easy in a manufacturing process.

In addition, as shown in FIGS. 13 and 14, by disposing the gate electrodes 506 and 507, the switching element 101 becomes mirror image symmetric with respect to a basic unit of a repetition structure thereof and there is an effect of becoming robust against a mask deviation in manufacturing.

«Ninth Embodiment»

A power conversion device according to a ninth embodiment of the present invention will be described with reference to FIG. 15.

Figure 15:
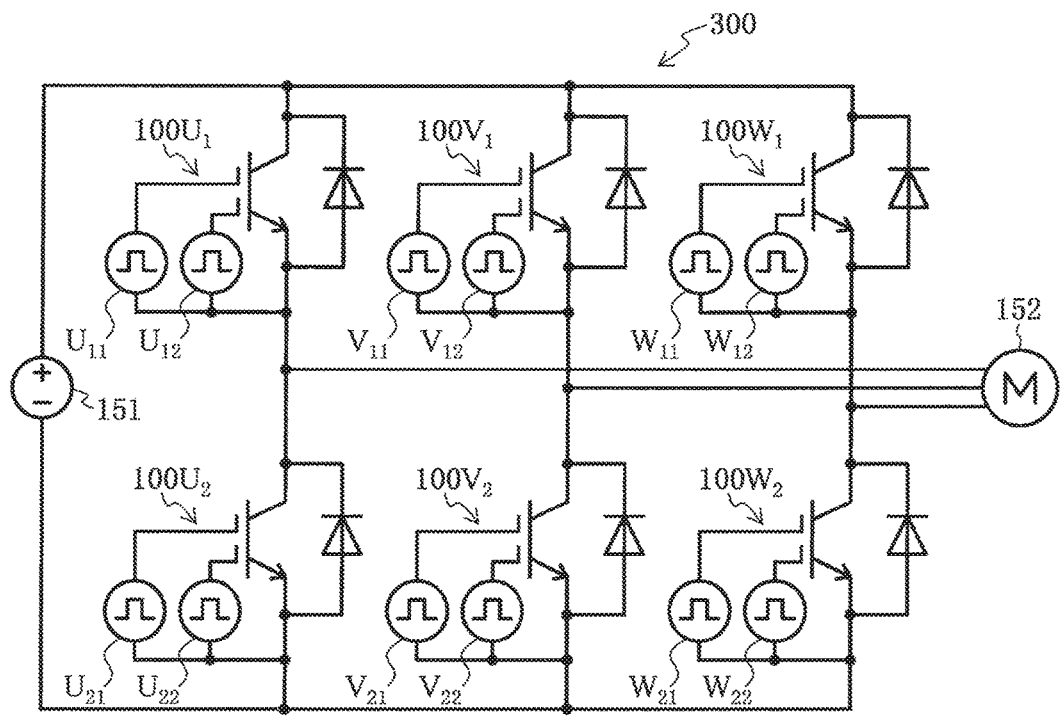
FIG. 15 is a diagram showing a circuit configuration example of a power conversion device according to a ninth embodiment of the present invention.

FIG. 15 is a diagram showing a circuit configuration example of the power conversion device according to the ninth embodiment of the present invention.

A power conversion device 300 according to the ninth embodiment shown in FIG. 15 configures a power conversion device as an inverter to drive a three-phase AC motor 152.

In FIG. 15, the power conversion device 300 is configured to include power conversion devices $100U_1$, $100U_2$, $100V_1$, $100V_2$, $100W_1$, and $100W_2$ shown in FIG. 1.

The power conversion devices $100U_1$ and $100U_2$, the power conversion devices $100V_1$ and $100V_2$, and the power conversion devices $100W_1$ and $100W_2$, which are connected in series, are connected to a DC voltage source 151.

In the power conversion devices $100U_1$ and $100U_2$, to output a U phase of a three-phase AC from a connection point thereof, the power conversion device $100U_1$ is controlled by drive signal sources $U_{11}$ and $U_{12}$ and the power conversion device $100U_2$ is controlled by drive signal sources $U_{21}$ and $U_{22}$.

The reason why the power conversion device $100U_1$ is controlled by two signals of the drive signal sources $U_{11}$ and $U_{12}$ is the same as the reason described in the first embodiment of FIG. 1. In addition, the reason why the power conversion device $100U_2$ is controlled by two signals of the drive signal sources $U_{21}$ and $U_{22}$ is the same.

In the power conversion devices $100V_1$ and $100V_2$, to output a V phase of the three-phase AC from a connection point thereof, the power conversion device $100V_1$ is controlled by drive signal sources $V_{11}$ and $V_{12}$ and the power conversion device $100V_2$ is controlled by drive signal sources $V_{21}$ and $V_{22}$.

In the power conversion devices $100W_1$ and $100W_2$, to output a W phase of the three-phase AC from a connection point thereof, the power conversion device $100W_1$ is controlled by drive signal sources $W_{11}$ and $W_{12}$ and the power conversion device $100W_2$ is controlled by drive signal sources $W_{21}$ and $W_{22}$.

With the above configuration, the power conversion device 300 functions as an inverter to convert a DC voltage (power) of the voltage source 151 into a three-phase AC voltage (power) of the U phase, the V phase, and the W phase and drives the three-phase AC motor 152.

Because the power conversion devices $100U_1$, $100U_2$, $100V_1$, $100V_2$, $100W_1$, and $100W_2$ are power conversion devices that can suppress voltage/current oscillations while using an SiC-SBD in a rectifier element having characteristics of a high withstand voltage and a low recovery loss, the power conversion device 300 configured using these power conversion devices becomes an inverter that has a high withstand voltage and a small power loss.

<Structure Example of SiC-SBD>

A structure of the SiC-SBD used in the rectifier element in the embodiments of the present invention is various and one example thereof is as follows.

Figure 16:
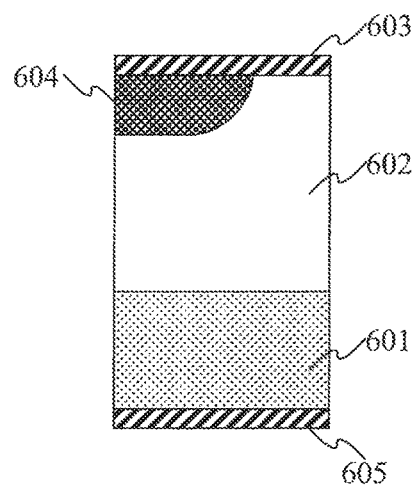
FIG. 16 is a diagram showing an example of a cross-sectional structure of an SiC-SBD.

FIG. 16 is a diagram showing an example of a cross-sectional structure of the SiC-SBD.

In FIG. 16, a low-concentration n-type semiconductor layer 602 is formed on a first surface of a high-concentration n-type semiconductor layer 601.

A p-type semiconductor layer 604 is selectively formed on a surface of the low-concentration n-type semiconductor layer 602.

A cathode electrode 605 having an ohmic junction is formed on a second surface of the high-concentration n-type semiconductor layer 601 and an anode electrode 603 having a Schottky junction is formed on the surfaces of the low-concentration n-type semiconductor layer 602 and the p-type semiconductor layer 604.

SiC is used for a semiconductor substrate on which the high-concentration n-type semiconductor layer 601, the low-concentration n-type semiconductor layer 602, and the p-type semiconductor layer 604 are formed.

«Other Embodiments»

Although the present invention have been described specifically on the basis of the embodiments, the present invention is not limited to the embodiments and various changes can be made without departing from the scope thereof. The configurations of other embodiments can be added to the configurations of the certain embodiment. In addition, for a part of the configurations of the individual embodiments, addition/removal/replacement of other configurations can be performed.

Other embodiments and modifications will be further described below.

«Structure of Switching Element»

Although the trench structure has been described as the structure of the switching element 101 in FIGS. 5 and 7 to 14, the present invention is not limited to the trench structure. For example, the structure may be a planar structure.

«Conductive Type of Semiconductor Substrate of Switching Element»

Although the drift layer 501 formed from the semiconductor substrate has been described as the n-type semiconductor layer in the structure of the switching element 101 in FIGS. 5, 7, and 8, the present invention is not limited to an n type. The drift layer 501 may be formed of a p-type semiconductor layer. When the drift layer 501 is the p-type semiconductor layer, an n-type semiconductor layer is used in the channel layer 502 and the collector layer 510.

«Type of IGBT of Switching Element»

Although the insulated gate semiconductor element (IGBT) has been described as the structure of the switching element 101 according to the first embodiment of the present invention, the semiconductor substrate represented by the drift layer 501 may be formed of Si or may be formed of SiC.

«Number of Gate Terminals of Switching Element»

Although the number of gate terminals of the switching element has been described as two in FIG. 1, the number may be three or more.

«Circuit Configuration of Power Conversion Device»

Although an example of the inverter to convert a DC voltage (power) into a three-phase AC voltage (power), shown in FIG. 15, is shown as an application example of the power conversion device, the present invention is not limited to the inverter.

For example, the power conversion device of FIG. 1 may be included in a converter to convert an AC voltage (power) into a DC voltage (power) or a power conversion device to convert an AC voltage (power) into an AC voltage (power) having a different voltage or frequency.

In addition, the power conversion device of FIG. 1 may be included in a power conversion device to convert a DC voltage (power) into a single-phase AC voltage (power), instead of three phases.

REFERENCE SIGNS LIST 100, 200, 300 power conversion device
101, 201 switching element
102, 202 rectifier element
103, 203 electric load (inductive load)
104, 204 voltage source
105, 106 gate terminal (insulated gate terminal)
107, 108, 205, $U_{11}$, $U_{12}$, $U_{21}$, $U_{22}$, $V_{11}$, $V_{12}$, $V_{21}$, $V_{22}$, $W_{11}$, $W_{12}$, $W_{21}$, $W_{22}$ drive signal source
401 parasitic inductance
402 junction capacitance
403 variable resistor
405 current source
406 ideal diode
501 drift layer (first-conductive-type first semiconductor layer)
502 channel layer (second-conductive-type second semiconductor layer)
503 trench
504 conductor
505 insulating film
506, 507 gate electrode (insulated gate electrode)
510 collector layer (second-conductive-type fourth semiconductor layer)
511 emitter electrode
512 collector electrode
513 source region (first-conductive-type third semiconductor layer)
601 high-concentration n-type semiconductor layer
602 low-concentration n-type semiconductor layer
603 anode electrode
604 p-type semiconductor layer
605 cathode electrode

The invention claimed is:

1. A power conversion device comprising:
a switching element; and
a rectifier element connected in series with the switching element, wherein
the power conversion device is constructed to connect with an external electric load at a connection point of the switching element and the rectifier element,
the switching element comprises an insulated gate semiconductor element having a first gate terminal and a second gate terminal,
the rectifier element comprises a diode having a Schottky junction using silicon carbide as a semiconductor substrate, and
the switching element is configured to apply different drive signals to the first gate terminal and the second gate terminal, respectively, and
wherein the insulated gate semiconductor element comprises
a first-conductive-type first semiconductor layer;
a second-conductive-type second semiconductor layer provided on a first surface of the first semiconductor layer;
a plurality of trenches penetrating the second semiconductor layer from a surface of the second semiconductor layer not contacting the first semiconductor layer and reaching the first semiconductor layer;
a plurality of gate electrodes configured to include a conductor provided in each of the plurality of trenches and an insulating film provided around the conductor;
a first-conductive-type third semiconductor layer provided on a surface of the second semiconductor layer not contacting the first semiconductor layer to be adjacent to the gate electrodes;
a second-conductive-type fourth semiconductor layer provided on a second surface of the first semiconductor layer;
an emitter electrode provided on a surface of the second semiconductor layer not contacting the first semiconductor layer and a surface of the third semiconductor layer; and
a collector electrode provided on a surface of the fourth semiconductor layer not contacting the first semiconductor layer,
wherein the plurality of gate electrodes comprises
a first gate electrode connected to the first gate terminal; and
a second gate electrode connected to the second gate terminal.

2. The power conversion device according to claim 1, wherein the third semiconductor layer comprises
a first layer of the third semiconductor layer adjacent to the first gate electrode; and
a second layer of the third semiconductor layer adjacent to the second gate electrode,
wherein a direction orthogonal to a depth direction of the trench and a width direction of the trench is set as a depth direction,
wherein the third semiconductor layer is repeatedly provided in the depth direction, and
wherein a ratio a1/b1 of a length a1 of the depth direction of the first layer of the third semiconductor layer and a length b1 of a repetition unit of the depth direction of the second semiconductor layer including the first layer of the third semiconductor layer is different from a ratio a2/b2 of a length a2 of the depth direction of the second layer of the third semiconductor layer and a length b2 of a repetition unit of the depth direction of the second semiconductor layer including the second layer of the third semiconductor layer.

3. The power conversion device according to claim 2, wherein the ratio a1/b1 is smaller than the ratio a2/b2.

4. The power conversion device according to claim 1, wherein
each first gate electrode is adjacent to one first gate electrode and one second gate electrode, and each second gate electrode is adjacent to one second gate electrode and one first gate electrode.

5. The power conversion device according to claim 1,
wherein the plurality of trenches comprise sets of two trenches adjacent to each other with the third semiconductor layer therebetween,
wherein an interval of two trenches belonging to a same set is smaller than an interval of two trenches adjacent to each other, but not belonging to the same set, and
wherein in each of the plurality of gate electrodes, one first gate electrode and one second gate electrode are provided in different trenches, respectively, in one of the sets of the trenches.

6. The power conversion device according to claim 5, wherein the third semiconductor layer comprises:
a first layer of the third semiconductor layer adjacent to the first gate electrode, and
a second layer of the third semiconductor layer adjacent to the second gate electrode,
wherein a direction orthogonal to a depth direction of the trench and a width direction of the trench is set as a depth direction,
wherein the third semiconductor layer is repeatedly provided in the depth direction, and
wherein a ratio a1/b1 of a length a1 of the depth direction of the first layer of the third semiconductor layer and a length b1 of a repetition unit of the depth direction of the second semiconductor layer including the first layer of the third semiconductor layer is different from a ratio a2/b2 of a length a2 of the depth direction of the second layer of the third semiconductor layer and a length b2 of a repetition unit of the depth direction of the second semiconductor layer including the second layer of the third semiconductor layer.

7. The power conversion device according to claim 6, wherein the ratio a1/b1 is smaller than the ratio a2/b2.

8. The power conversion device according to claim 5, wherein
each first gate electrode is adjacent to one first gate electrode and one second gate electrode, and
each second gate electrode is adjacent to one second gate electrode and one first gate electrode.

9. The power conversion device according to claim 1, wherein
a width of each of the plurality of trenches is larger than an interval of the trench and a trench adjacent to the trench, and
in one of the plurality of trenches, one first gate electrode and one second gate electrode contact different sidewalls of one trench, respectively.

10. The power conversion device according to claim 9, wherein the third semiconductor layer comprises:
a first layer of the third semiconductor layer adjacent to the first gate electrode; and
a second layer of the third semiconductor layer adjacent to the second gate electrode,
wherein a direction orthogonal to a depth direction of the trench and a width direction of the trench is set as a depth direction,
wherein the third semiconductor layer is repeatedly provided in the depth direction, and
wherein a ratio a1/b1 of a length a1 of the depth direction of the first layer of the third semiconductor layer and a length b1 of a repetition unit of the depth direction of the second semiconductor layer including the first layer of the third semiconductor layer is different from a ratio a2/b2 of a length a2 of the depth direction of the second layer of the third semiconductor layer and a length b2 of a repetition unit of the depth direction of the second semiconductor layer including the second layer of the third semiconductor layer.

11. The power conversion device according to claim 10, wherein the ratio a1/b1 is smaller than the ratio a2/b2.

12. The power conversion device according to claim 9, wherein
each first gate electrode is adjacent to one first gate electrode and one second gate electrode, and
each second gate electrode is adjacent to one second gate electrode and one first gate electrode.

* * * * *